United States Patent
Kleppe

(10) Patent No.: US 10,114,060 B2
(45) Date of Patent: Oct. 30, 2018

(54) NEGATIVE BATTERY MAIN CONTACTOR STATUS DETERMINATION

(71) Applicant: Continental Automotive Systems, Inc., Auburn Hills, MI (US)

(72) Inventor: Sebastian Kleppe, Braunschweig (DE)

(73) Assignee: Continental Automotive Systems, Inc., Auburn Hills, MI (US)

( * ) Notice: Subject to any disclaimer, the term of this patent is extended or adjusted under 35 U.S.C. 154(b) by 332 days.

(21) Appl. No.: 14/989,864

(22) Filed: Jan. 7, 2016

(65) Prior Publication Data

US 2016/0238665 A1    Aug. 18, 2016

Related U.S. Application Data

(60) Provisional application No. 62/116,866, filed on Feb. 16, 2015.

(51) Int. Cl.
| | |
|---|---|
| *B60L 11/18* | (2006.01) |
| *G01R 31/04* | (2006.01) |
| *G01R 31/36* | (2006.01) |
| *G01R 31/00* | (2006.01) |

(52) U.S. Cl.
CPC ............ *G01R 31/04* (2013.01); *G01R 31/006* (2013.01); *G01R 31/3627* (2013.01)

(58) Field of Classification Search
CPC .............. G01R 31/362; G01R 31/3679; B60L 11/1816; B60L 11/1838; B60L 11/1803; B60L 11/18; H01M 8/0618; H01M 8/04097

USPC .. 324/425, 426, 427, 429, 430–437, 750.24; 320/101, 104, 109, 118, 105; 307/31, 23, 307/10.1; 429/410, 420

See application file for complete search history.

(56) References Cited

U.S. PATENT DOCUMENTS

| | | | | |
|---|---|---|---|---|
| 4,394,741 | A * | 7/1983 | Lowndes | B60L 11/1853 320/100 |
| 5,804,944 | A * | 9/1998 | Alberkrack | H02J 7/0011 320/163 |
| 8,174,237 | B2 * | 5/2012 | Kosugi | B60L 3/0046 320/116 |
| 8,896,273 | B2 * | 11/2014 | Miyazaki | H02J 7/0026 320/116 |
| 2011/0210746 | A1 * | 9/2011 | Yugou | B60L 3/04 324/427 |

(Continued)

*Primary Examiner* — Jermele M Hollington
*Assistant Examiner* — Taqi Nasir

(57) ABSTRACT

A system, method, and battery control module for detecting negative contactor status of a battery, such as a high voltage vehicle battery, is disclosed. The method includes applying a constant current to a bipolar transistor element having a base, an emitter, and a collector, wherein the base is electrically connected to a first resistor and an analog-to-digital converter, the collector being electrically connected to a second resistor and a diode. A collected current is delivered by the collector, and the method includes injecting the collected current through the second resistor and the diode and into a negative contactor of a battery. The method also includes determining a resistance across the negative contactor of the battery. The system may include a battery having a negative contactor, the negative contactor having a switch side, and a battery control module in communication with the battery.

7 Claims, 2 Drawing Sheets

(56) References Cited

U.S. PATENT DOCUMENTS

| | | | | |
|---|---|---|---|---|
| 2012/0194135 A1* | 8/2012 | Mizoguchi | ......... | G01R 31/3658 320/118 |
| 2012/0194199 A1* | 8/2012 | Mizoguchi | ......... | G01R 31/3658 324/433 |
| 2014/0046534 A1* | 2/2014 | Lazar, II | ................... | B60L 3/04 701/33.9 |
| 2014/0225622 A1* | 8/2014 | Kudo | .................... | B60L 3/0046 324/433 |
| 2015/0130469 A1* | 5/2015 | Bolduc | ................ | G01R 31/362 324/426 |

\* cited by examiner

NEGATIVE BATTERY MAIN CONTACTOR STATUS DETERMINATION

TECHNICAL FIELD

The present disclosure relates to hybrid and electric vehicle systems, and more particularly, to battery management systems for high voltage batteries.

BACKGROUND

Government regulations and consumer desires demand that vehicles continuously improve on fuel economy and emissions. At the same time, vehicle affordability is a concern, in light of the numerous automotive requirements and increasing costs. Accordingly, there is a need for more fuel efficient and low-emission engines that are also without added complexity and cost.

Electrically powered and hybrid (conventionally fossil fuel power in combination with electrical power) vehicles are a viable solution for reducing emissions and improving fuel economy. Such vehicles are becoming increasingly attractive alternatives to fossil fuel powered cars. Electric and hybrid vehicles require high voltage applications having relatively large capacity battery systems with relatively large amounts of power compared to a 12 V automobile storage batter. However, because of the high voltage requirements, significant safety concerns are raised.

Accordingly, high voltage battery management systems incorporate safety features and monitoring systems. For example, negative contactors of the high voltage battery packs are monitored to determine whether the negative contactor is open, closed, or in-between, in order to determine whether the high voltage battery pack can be safely connected and used within the vehicle.

Conventional high voltage battery management systems typically perform high voltage (HV) level control from the low voltage (LV) side of the board. That requires the HV sensors, actuators, and communication to be isolated from, and transported to, the LV side of the board by way of optical photomos or digital isolators. Such systems typically use a significant number, e.g., 14, isolation components between the high voltage side and the low voltage side of the board. Components of this type are expensive, and automotive qualified components of this type are limited.

Various methods have been used for contactor negative status detection. In one example, switching components, such as a photomos, may be used and controlled from the low voltage side of the board. The midpoint of the pack may be used as a main reference to all other voltage measurements and ground for active components. Voltages more negative than the midpoint, like the contactor negative, then require an operational amplifier as an active component, to invert the signal and allow the use of a positive voltage analog-to-digital converter (ADC). This results in an analog voltage measurement, from which, with detailed system knowledge, the resistance of the negative contactor can be determined. Due to interference with changing high voltage pack potential, however, as well as needed circuitry, this solution is expensive and may be inaccurate.

In another example, the voltage drop created by the load current through the negative contactor may be measured, resulting in a measurement of the contact resistance of the contactor. A load current is required, and at low load currents, a voltage drop is difficult to measure due to the low contact resistance of the contactor.

In yet another example, a voltage may be injected, and the effect of the DC link on the voltage may be measured to determine the contactor status. This method, however, may not be accurate, and more components may be needed to protect for higher voltage, as the voltage sourced used for injection is typically the HV Battery Pack itself.

Accordingly, a need exists for a simple solution to determine the negative contactor status, which is cost effective.

SUMMARY

Disclosed is a system, method, and battery control module for detecting contactor negative status in a high voltage battery system, which is simple, cost effective, and without added complexity or additional hardware components.

In one form, which may be combined with or separate from the other forms described herein, a method for detecting negative contactor status of a battery is disclosed. The method includes applying a constant current to a bipolar transistor element having a base, an emitter, and a collector, wherein the base is electrically connected to a first resistor and an analog-to-digital converter, the collector being electrically connected to a second resistor in series with a diode, the collector delivering a collected current. The method further includes injecting the collected current through the diode and into a negative contactor of a battery, and determining a resistance across the negative contactor of the battery.

In another form, which may be combined with or separate from the other forms disclosed herein, a system for detecting negative contactor status of a battery is disclosed. The system includes a battery having a negative contactor, and the negative contactor has a switch side. A battery control module is in communication with the battery. The battery control module includes a diode and a first resistor, the first resistor and the diode being electrically connected with the negative contactor, and a bipolar transistor having a base, an emitter, and a collector, the collector being electrically connected to the first resistor. The battery control module also includes a second resistor and an analog-to-digital converter, each of the second resistor and the analog-to-digital converter being connected to the base of the bipolar transistor. A constant current source is electrically connected to the emitter of the bipolar transistor. The battery control module is configured to apply a constant current through the constant current source and to determine a switch side resistance of the negative contactor.

In still another form, which may be combined with or separate from the other forms described herein, a battery control module configured to determine negative contactor status of a battery is provided. The battery control module includes a first control logic configured to apply a constant current to a bipolar transistor element having a base, an emitter, and a collector, the base being electrically connected to a first resistor and an analog-to-digital converter. The collector is electrically connected to a second resistor and a diode, the collector delivering a collected current. A second control logic is configured to inject the collected current through the second resistor and the diode and into a negative contactor of a battery. A third control logic is configured to determine a resistance across the negative contactor of the battery.

Further features and advantages of the present disclosure will become apparent from consideration of the following description and the appended claims, when taken in connection with the accompanying drawings. It should be understood that the description and specific examples are intended for purposes of illustration only and are not intended to limit the scope of the present disclosure.

BRIEF DESCRIPTION OF THE DRAWINGS

Examples are reflected in the drawings, which will be described below. The drawings described herein are for illustration purposes only and are not intended to limit the scope of the present disclosure in any way. The drawings show.

DETAILED DESCRIPTION

The following description is merely exemplary in nature and is not intended to limit the present disclosure, application, or uses.

Certain terms are used throughout the following description and claims to refer to particular system components and configurations. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ".

Examples of the invention are described below. It should be noted that these and other examples or embodiments are exemplary and are intended to be illustrative of the invention rather than limiting. While the invention is widely applicable to different types of systems, it is impossible to include all of the possible embodiments and contexts of the invention in this disclosure. Upon reading this disclosure, many alternative embodiments of the present invention will be apparent to persons of ordinary skill in the art. Other embodiments may be utilized, and other changes may be made, without departing from the spirit or scope of the subject matter presented here.

Figure 1:
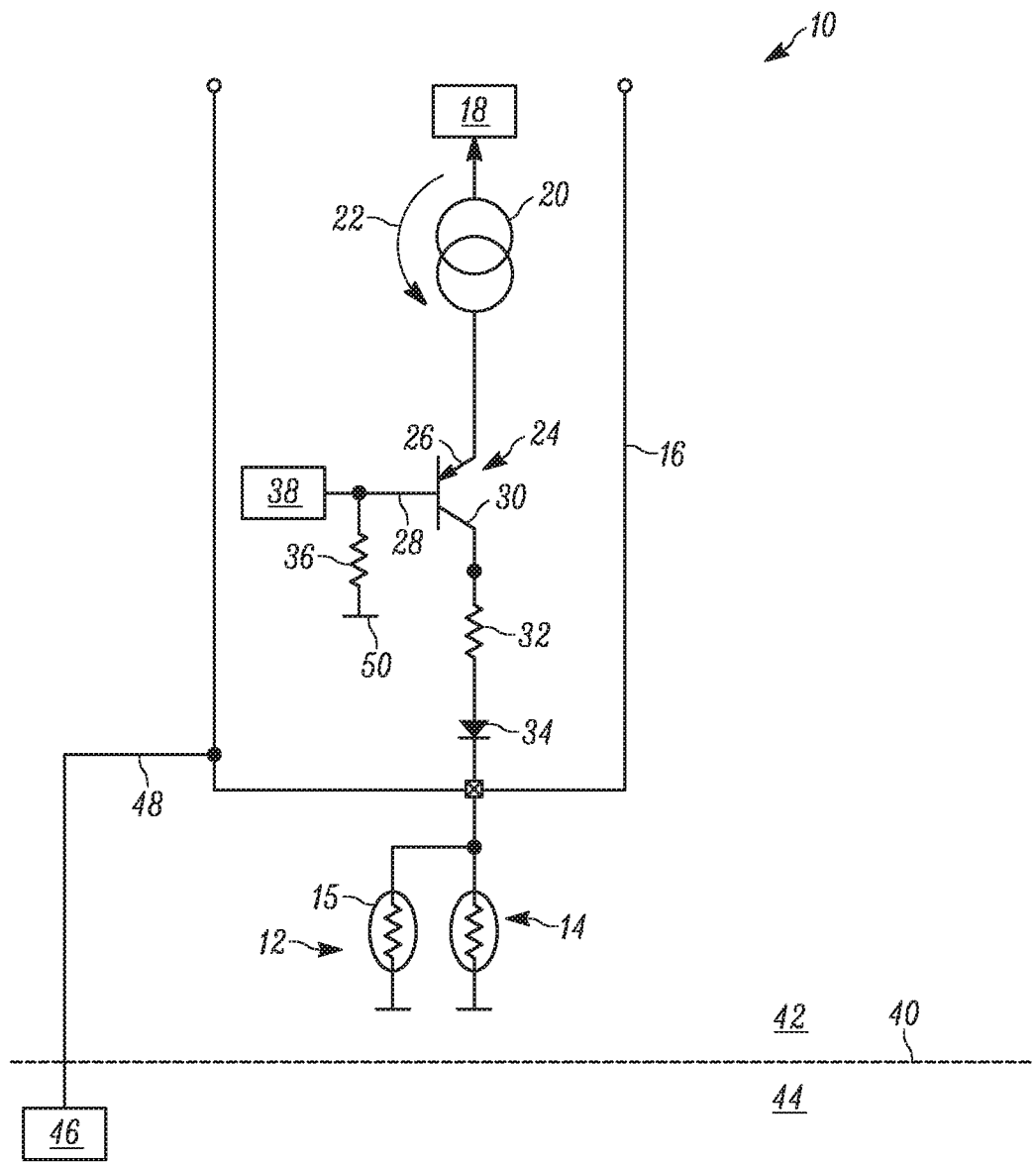
FIG. 1 is a schematic circuit diagram illustrating a system for detecting for negative contactor status of a battery, included in a battery control module, in accordance with the principles of the present disclosure.

With reference to FIG. 1, a system for detecting negative contactor status of a battery is illustrated and generally designated at 10. The system 10 includes a battery 12 having a HV switching element on its negative pole, typically in form of a contactor 14, as illustrated in FIG. 1. The battery 12 may be a high voltage battery 12, for example, having a voltage in the range of about 150 V to about 400 V. The battery 12 may also have an unknown parasitic resistance 15 in parallel with the negative contactor 14. The negative contactor 14 may be the high voltage vehicle DC Link, having a nominal zero voltage and transients of, e.g., −600V to +600V.

A battery control module 16 is in communication with the terminals of the battery 12. The battery control module 16 includes an isolated voltage source 18 connected to circuitry which creates a current source 20 having a voltage drop 22 across the current source 20. The current source 20 is electrically connected to a bipolar transistor 24, such as a bipolar junction transistor. The bipolar transistor 24 has an emitter 26, a base 28, and a collector 30. The current source 20 is electrically connected to the emitter 26.

A resistor 32 is electrically connected to the collector 30, a diode 34 is electrically connected to the resistor 32, and the diode 34 is electrically connected to the negative contactor 14 HV switching element, inside the battery 12. Each of the collector 30, the resistor 32, the diode 34, and the negative contactor 14 are connected in series such that the resistor 32 is disposed in series between the collector 30 and the diode 34, and the diode 34 is disposed in series between the resistor 32 and the negative contactor 14; or in another variation, the diode 34 may be disposed in series between the collector 30 and the resistor 32, and the resistor 32 may be disposed in series between the diode 34 and the negative contactor 14. Another resistor 36 and an analog-to-digital converter (ADC) 38 are electrically connected to the base 28.

The battery control module 16 is configured to apply a constant current through the constant current source 20 and to determine a switch side resistance of the negative contactor 14.

A high voltage/low voltage barrier is schematically illustrated at 40. The high voltage/low voltage barrier 40 has a high voltage side 42 and a low voltage side 44. The high voltage side 42 is partitioned from a set of low voltage functions on the low voltage side 44 to minimize the communication that occurs between the high voltage side 42 and the low voltage side 44 of the board. A logic controller 46 on the low voltage side 44 may communicate with the battery control module 16 on the high voltage side 42 via one or more dedicated serial communication buses 48, such as CAN, SPI, or the like. As shown, the battery control module 16 is configured to control the switching element of the battery 12 from the high voltage side 42 of the high voltage/low voltage barrier 40.

The battery control module 16 is configured to determine the resistance across the negative contactor 14 of the battery 12 by referencing to a high voltage ground 50. The battery control module 16 is configured to measure with the analog-to-digital converter (ADC) 38 and transmit an analog-to-digital converter measurement across the high voltage/low voltage barrier 40 via the serial protocol 48.

The isolated power supply 18 has to have a higher voltage than the sum of the max voltage through the ADC 38 plus the voltage through the transistor 24 plus the voltage drop 22. However, the power supply 18 does not need to be a well-regulated power supply. The current source 20 can be built using components specified for low voltages. The constant current can be chosen with respect to the expected resistance range to be measured and the maximum acceptable power losses on the bipolar transistor 24, during maximum negative transient voltage on the vehicle DC Link.

The known current will divide between the base 28 and the collector 30 of the bipolar transistor 24. Operating the bipolar transistor 24 in saturation most of the time, a drift in its current amplification, does not cause any error in the measurement. By measuring the base 28 current, the collector 30 current, and therefore contact resistance of the negative contactor 14 can be determined.

The resistor 36 is used as a sense resistor, to translate base 28 current to a voltage, which can then be converted by the ADC 38. The resistor 36 is selected with respect to the ADC 38 range and the generated constant current. By choosing a bipolar junction transistor 24 that can withstand the difference of the maximum negative transient voltage on the DC Link from the voltage generated by the isolated power supply 18 ($V\_18$−maximum negative transient voltage on the DC Link), the complete circuit is protected from negative transients. By choosing a diode 34 that can withstand the difference of the maximum positive transient voltage on the DC Link from the voltage generated by the isolated power supply 18 (V_18–maximum positive transient voltage on the DC Link), in reverse direction, the complete circuit is protected from positive transients.

A constant current is beneficial over known solutions where the current source 20 is replaced by a resistive element, due to better accuracy and comparably simple implementation of measures to protect from transient voltages on the DC Link. A comparably lower voltage is required to be blocked by the transistor 24, during negative voltage transients on the DC Link. In a 400V battery pack, for example, the transistor 24 could be biased to 1 kV, which limits available components significantly.

Thus, the battery control module 16 may be configured to determine negative contactor status of a battery by implementing certain control logics. For example, the battery control module 16 may have a first control logic configured to apply a constant current to the bipolar transistor element 24, a second control logic configured to inject the collected current through the resistor 32 and the diode 34 and into a negative contactor 14 of a battery 12, and a third control logic configured to determine a resistance across the negative contactor 14 of the battery 12. The battery control module 16 may be configured to determine the resistance across the negative contactor 14 of the battery 12 by referencing a high voltage ground 50. The second control logic may be configured to inject the collected current into a DC Link side of the negative contactor 14 of the battery 12. The battery control module 16 may be configured to measure with the analog-to-digital converter 38 and transmit an analog-to-digital converter measurement across the high voltage/low voltage barrier 40 via a serial protocol 46, by way of example.

Figure 2:
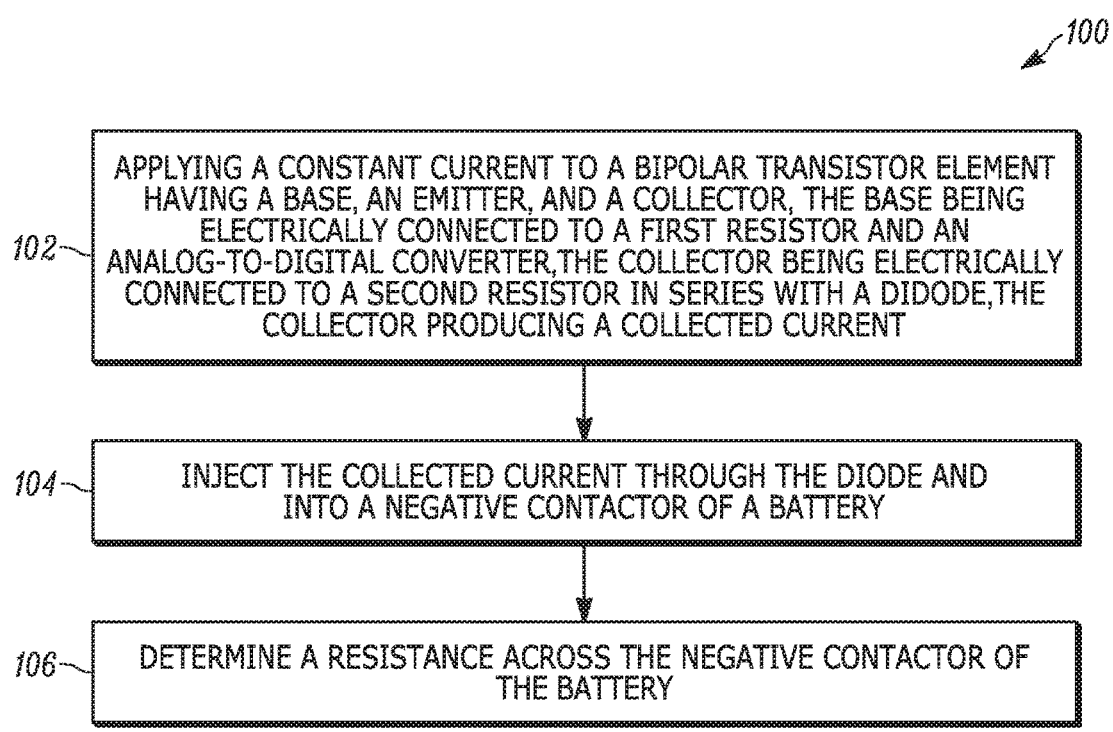
FIG. 2 is a block diagram illustrating a method for detecting negative contactor status of a battery, according to the principles of the present disclosure.

Referring now to FIG. 2, a method for detecting negative contactor status of a battery is illustrated and generally designated at 100. The method 100 may be used with the system 10 illustrated in FIG. 1, if desired. The method 100 may include a step 102 of applying a constant current to a bipolar transistor element having a base, an emitter, and a collector, the base being electrically connected to a first resistor and an analog-to-digital converter, the collector being electrically connected to a second resistor in series with a diode.

The method 100 may also include a step 104 of injecting the collected current through the diode and into a negative contactor of a battery, and a step 106 of determining a resistance across the negative contactor of the battery. The steps 102, 104, 106 may incorporate other steps as described anywhere herein, such as described above. For example, the injecting step 104 may include injecting the collected current into a DC Link side of the negative contactor of the battery. The method 100 may also include a step of controlling the switching element from a high voltage side of a high voltage/low voltage barrier. The step 106 of determining the resistance across the negative contactor of the battery may include referencing a high voltage ground. Further, the method 100 may include powering the current source with an isolated power supply. The method 100 may include measuring with the analog-to-digital converter and transmitting an analog-to-digital converter measurement across a high voltage/low voltage barrier via a serial protocol.

It is further understood that an of the above described concepts can be used alone or in combination with any or all of the other above described concepts. As a person skilled in the art will readily appreciate, the above description is meant as one illustration of the principles of the invention. This description is not intended to limit the scope or application of the invention in that the invention is susceptible to modification, variation, and change, without departing from the spirit and scope of the invention, as defined in the following claims.

What is claimed is:

1. A system for detecting negative contactor status of a battery, the system comprising:
    a battery having a negative contactor, the negative contactor having a switch side; and
    a battery control module in communication with the battery, the battery control module comprising:
        a diode and a first resistor, the first resistor and the diode being electrically connected with the negative contactor;
        a bipolar transistor having a base, an emitter, and a collector, the collector being electrically connected to the first resistor;
        a second resistor and an analog-to-digital converter, each of the second resistor and the analog-to-digital converter being connected to the base of the bipolar transistor; and
        a constant current source being electrically connected to the emitter of the bipolar transistor,
        wherein the battery control module is configured to apply a constant current through the constant current source and to determine a switch side resistance of the negative contactor.

2. The system of claim 1, wherein the battery is a high voltage battery in the range of about 150V to about 400V.

3. The system of claim 2, wherein the current source comprises an isolated voltage source power supply.

4. The system of claim 3, wherein the collector, the first resistor, the diode, and the negative contactor are connected in series, the first resistor being disposed in series between the collector and the diode, the diode being disposed in series between the first resistor and the negative contactor.

5. The system of claim 4, the battery comprising a switching element, the battery control module comprising a high voltage/low voltage barrier having a high voltage side, the battery control module being configured to control the switching element from the high voltage side of the high voltage/low voltage barrier.

6. The system of claim 5, the battery control module being configured to determine the resistance across the negative contactor of the battery by referencing a high voltage ground.

7. The system of claim 5, the battery control module being configured to measure with the analog-to-digital converter and transmit an analog-to-digital converter measurement across the high voltage/low voltage barrier via a serial protocol.

* * * * *